United States Patent [19]
McIntyre

[11] Patent Number: 5,447,189
[45] Date of Patent: Sep. 5, 1995

[54] METHOD OF MAKING HEAT SINK HAVING ELLIPTICAL PINS

[76] Inventor: Gerald L. McIntyre, 21123 Patriot Way, Cupertino, Calif. 95014

[21] Appl. No.: 168,464

[22] Filed: Dec. 16, 1993

[51] Int. Cl.⁶ ................................................. F28F 7/00
[52] U.S. Cl. ............................................ 165/1; 165/185
[58] Field of Search ............................... 165/185, 1

[56] References Cited

U.S. PATENT DOCUMENTS

| | | | |
|---|---|---|---|
| 3,524,497 | 8/1970 | Chu et al. | |
| 4,770,242 | 9/1988 | Daikoku et al. | 165/185 |
| 4,800,956 | 1/1989 | Hamburger | 165/185 |
| 5,052,481 | 10/1991 | Horvath | 165/185 |
| 5,158,136 | 10/1992 | Azar | 165/185 |
| 5,215,140 | 6/1993 | Beane | 164/65 |
| 5,270,902 | 12/1993 | Bellar et al. | 165/185 |

*Primary Examiner*—A. Michael Chambers
*Attorney, Agent, or Firm*—Robert Samuel Smith

[57] ABSTRACT

A method of making a heatsink characterized by an array of pins secured to a baseplate in which each pin has an elliptical cross section and the ratio of a length of the pin to the major axis of the cross section is about fifteen and a ratio of the length to the minor axis is about sixty. The heatsink is made using an investment casting technique involving the forming of a wax pattern.

8 Claims, 3 Drawing Sheets

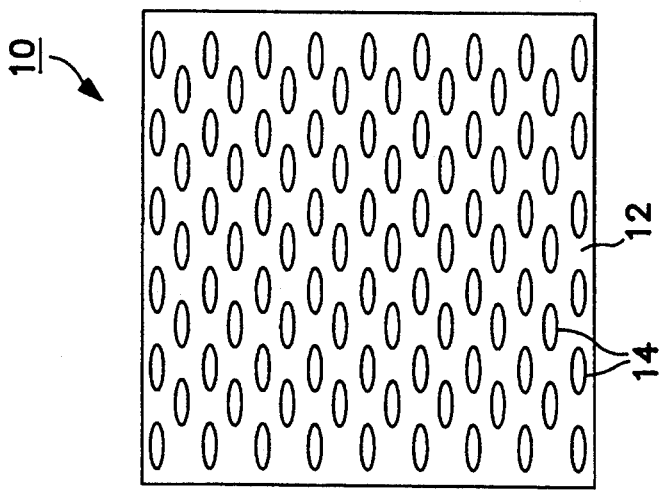
FIG. 2
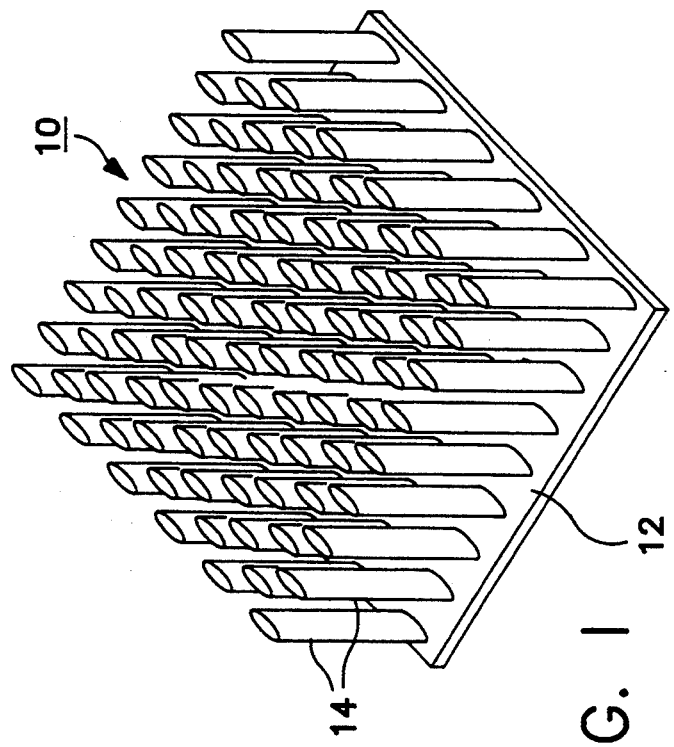
FIG. 1
1. Form wax pattern
2. Build tree
3. Place container with tree in chamber and evacuate
4. Form plaster casting
5. Bake plaster casting to drain wax
6. Bake plaster casting to expel moisture
7. Evacuate hot plaster casting
8. Pour molten alloy into evacuated cavities
9. Break casting away from Heatsinks
FIG. 3

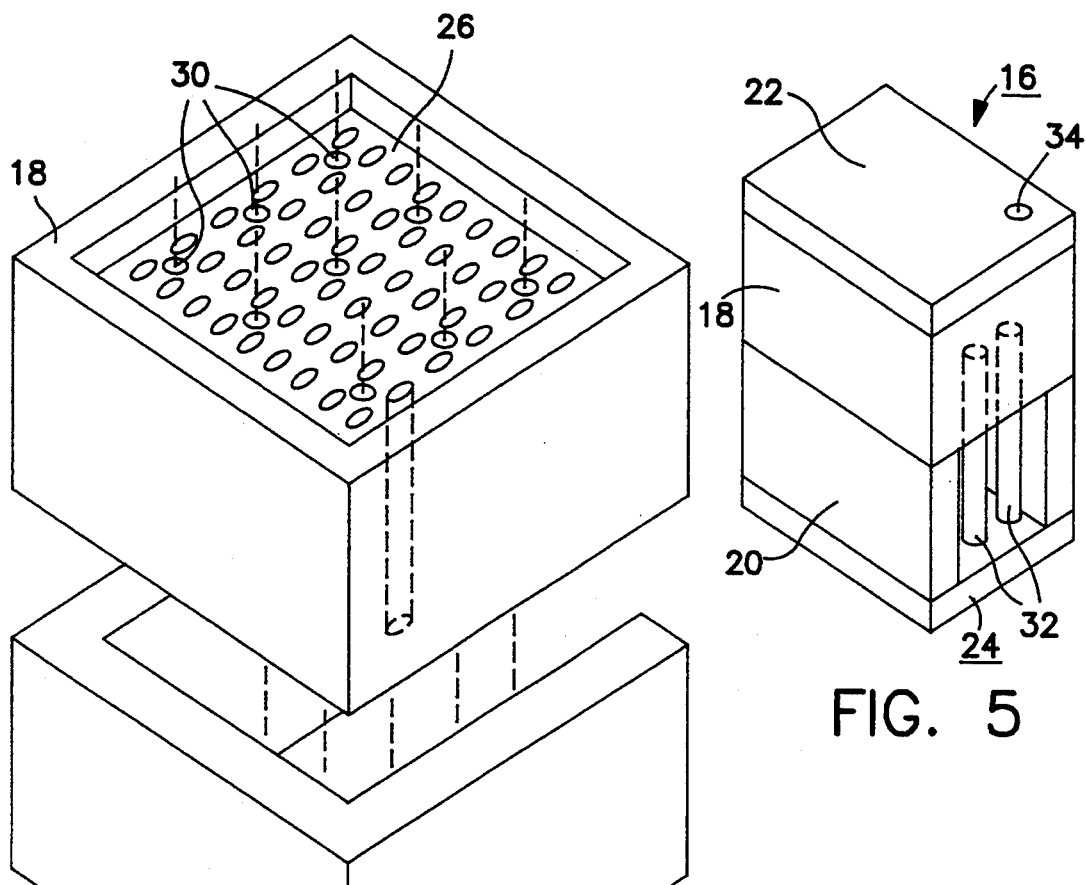
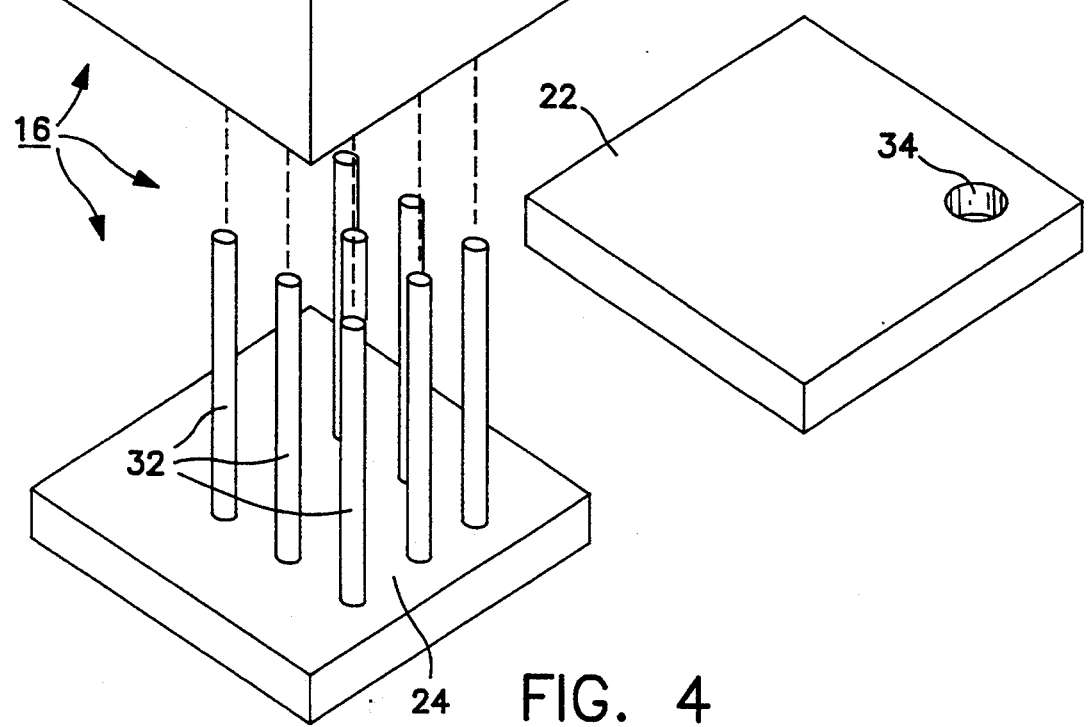
FIG. 5
FIG. 4

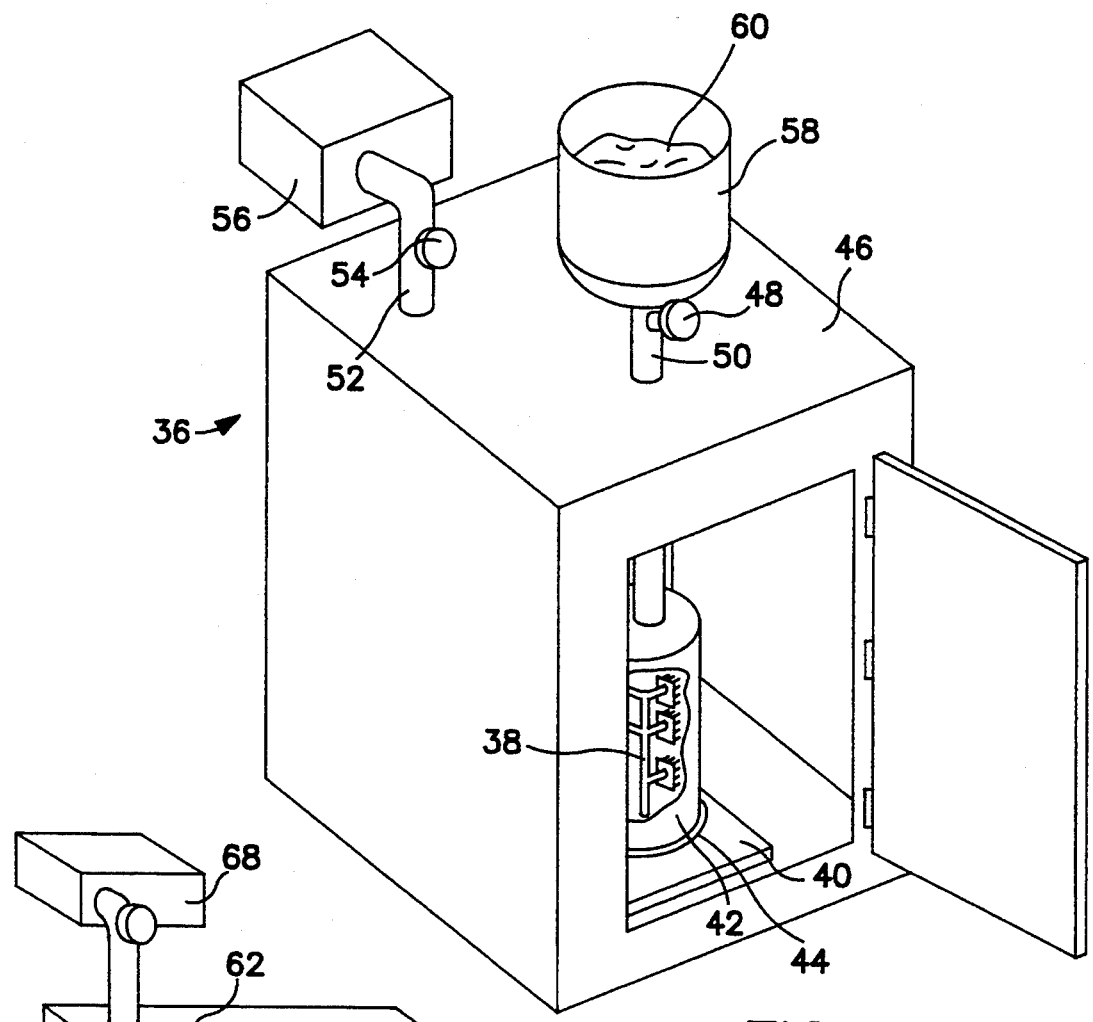
FIG. 6
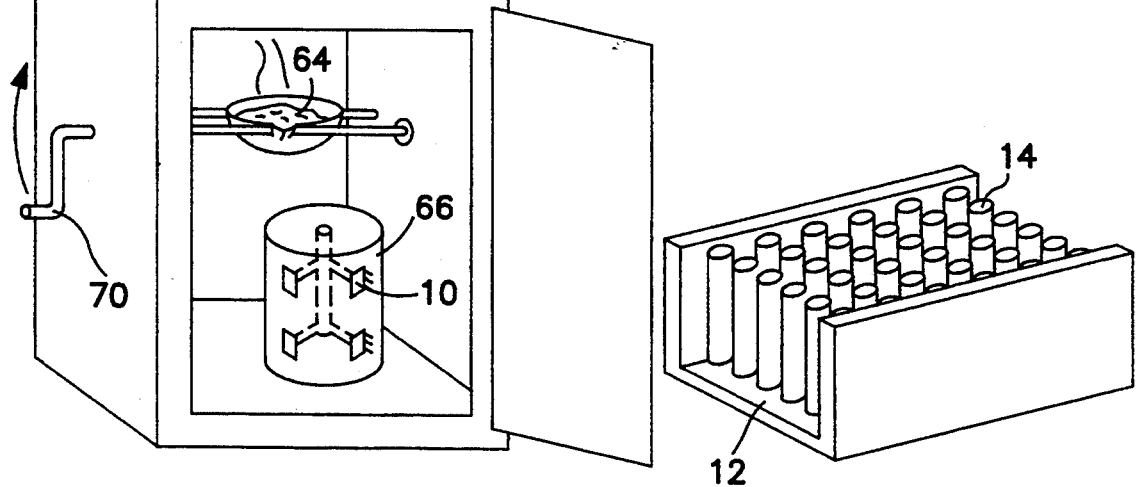
FIG. 7
FIG. 8

METHOD OF MAKING HEAT SINK HAVING ELLIPTICAL PINS

BACKGROUND

1. Field of the Invention

This invention relates to heatsinks and methods of making and particularly to a heatsink having an array of pins in which the shape and position of each pin and its orientation with respect to the overall array of pins is selected to optimize dissipation of heat.

2. Prior Art and Information Disclosure

The demand for more efficient heat sinks such as are used for cooling integrated circuit chips and similar electonic devices has increased in proportion to increased power generated per surface area as the industry progresses from one generation of chip development to the next. The fabrication of an "ideal" heat sink of the type that would be useful with electronic components and particularly with integrated circuits poses special problems that are inherent in the objective to maximize area of the heat radiating surface and directing air flow to follow the most efficient pattern. Earlier approaches were characterized as having metal strips parallel to one another and supported with an edge secured to a base plate. Techniques for fabricating this style of heatsink involved extruding metal to form the array of elongated strips. However, the extrusion technique does not lend itself to more complicated constructions that present greater heat radiating surface area. The most recent disclosures are directed toward heatsinks comprising an array of pins wherein each pin has an end secured to a base plate which abuts the surface of the device being cooled.

U.S. Pat. No. 3,524,497 to Chu et al discloses a heat transfer device including a pair of parallel panels in which one panel has an array of cylindrical pins, each having an end secured to one panel surface facing another panel surface to which is secured an array of "tubulator" pins which are basically pins with a rectangular cross section but with the corners of the rectangular cross section curved to provide a more even flow of air along the corridors between pins when the array of tubulator pins intermingles with the array of cylindrical pins. The two opposing base plates are described in this disclosure as being any one of a number of materials (metal or plastic) implying that the ends of the pins are bolted to the base plates. No method for constructing the heatsink is disclosed that would be practical for building the small many-pin heatsinks that are required for today's fast developing integrated circuit industry.

U.S. Pat. No. 5,158,136 to Azar discloses an array of cylindrical pins on a base plate with panels vertically mounted along the outer edge of the array to redirect the flow of air through the array for greater efficiency. The arrangement of the panels in this heatsink is very simple and not necessarily the most efficient arrangement of panels with surfaces for diverting air flow to maximize heat dissipation.

U.S. Pat. No. 5,215,140 to Beane discloses a method for diecasting a heatsink comprising a base plate with an array of cylindrical pins vertically mounted on the base plate. Several characteristics are inherent in the diecasting technique which present limitations on the desired intricacy that can be achieved in fabricating the heatsink. One limitation is the thermal characteristics of the metal mold. (Beane states that the preferred mold described in the method of U.S. Pat. No. 5,215,140 is steel), col. 2 line 37 and the process step of claim 1 involves "solidifying said thermally conductive material is said mold and removing the resultant molded heat sink". The steel mold is a good heat conductor When a molten aluminum alloy enters the mold, aluminum in contact with the cavity wall solidifies to form a skin and further freezing progresses toward the center of the casting. Freezing is accompanied by shrinkage of the alloy so that voids occur in the casting as a result of variations in rate of freezing throughout sections of the diecast regardless of the degree of evacuation of gases prior to casting. As stated in U.S. Pat. No. 5,215,140 the greatest density that can be achieved in making diecasts such as the pin heatsink is about 90% maximum The diminished density of the part results in a reduced heat conductivity of the diecast thereby decreasing its efficiency as a heatsink.

The rate of cooling is also a factor in determining the crystal size of the cast part. The faster is the rate of cooling then the smaller is the crystal size of the solidified part. This condition is conducive to a more brittle part. Furthermore, small crystal size decreases the heat conductivity of the part so that the heat dissipating capability of the heatsink is diminished. The heat conductivity of the metal mold also places a limitation on the intricacy of the part in terms of the length of part measured from the gate of the mold to the most distal end of the casting versus the cross section of the casting transverse to the length.

The conductive properties of the die cast limit also place a limitation on the length of the part that can be diecast relative to its cross sectional area. In order to extend this limit, aluminum alloys containing a relatively large percent of zinc are preferred for the diecast process. However, concentrations of zinc such are used to manufacture the heatsinks of the type addressed in this disclosure materially reduce the heat conductivity and therefore the efficiency of the diecast heatsink.

Investment casting is a process that has been used for many years to produce intricate castings such as figurines. The technique generally involves forming a wax model of the part to be produced by:

pouring molten wax into a mold such as a flexible mold from which the wax casting can be separated;

pouring investment casting plaster around the wax model to form a plaster casting;

heating the plaster casting to drain and burn out the wax leaving a cavity in the plaster casting;

pouring molten metal into the cavity left in the plaster mold;

breaking the plaster casting away from the metal part.

THE INVENTION

Objects

It is an object of this invention to provide a heat sink having a larger heat dissipating area per area of baseplate than can be achieved using fabrication methods of the prior art for producing heatsinks.

It is another object to produce a heatsink fabricated from an alloy which has better heat conductivity than do the alloys that are most commonly used in the diecast process.

It is another object that the the density of the part produced by the method of the invention be substantially greater than the density of parts produced by diecasting.

It is another object to adapt the method of this invention to fabricate heatsinks using an aluminum alloy selected to have a thermal expansion coefficient that more nearly matches the thermal expansion coefficients of the ceramic and plastic components than the heatsink is intended to protect than is the case with heatsinks of the prior art.

It is another object that the method of manufacture not be characterized by defects such as cracks in the part resulting from mismatch of thermal coefficients of expansion between the materials of a metal mold and the injection molded part.

Summary

This invention is directed toward a heatsink comprising an array of pins vertically secured to a base wherein the pins have an elliptical cross section in which the minor axis of the elliptical cross section relative to the length of the pin is substantially smaller than can be achieved by other methods of manufacture such as die casting. The method of this invention can be used to make heatsinks with an array of pins in which the pins are greater than 0.5 inches long, the ratio of the pin length to thickest dimension of the cross section is greater than ten and the ratio of the of the major axis to the minor axis is greater than two and one half.

The method of this invention for producing the heat sink involves the steps of molding a number of wax patterns each of which has the shape of the heatsink and securing the patterns to a wax runner. The assembled runner and patterns is placed in a container that is then evacuated and backfilled with a slurry of precured plaster. After the plaster sets to form a plaster casting, the casting is removed from the container arid heated to a temperature of at least 1350 degrees fahrenheit such as to drain the wax, burn off any residue of wax remaining in cavities left in the plaster casting and driving any moisture from the plaster casting. The plaster casting is then placed in a vacuum chamber while still at a temperature of at least 550 degrees fahrenheit where it is again evacuated to remove ambient gases. A ladle of molten alloy (preferably an aluminum alloy) that has been positioned in the vacuum chamber along with the plaster is then tipped such as to pour molten metal into the evacuated cavities of the casting. The heatsinks thus formed in the, cavities are then separated from the plaster by breaking the plaster casting.

BRIEF DESCRIPTION OF THE DRAWINGS:

FIG. 1 shows a heat sink of the invention.
FIG. 2 is a top view of FIG. 1.
FIG. 3 is a flow chart of the process of the invention.
FIG. 4 is an exploded view showing the tool for forming the wax pattern.
FIG. 5 is an assembly view of the tool of FIG. 4.
FIG. 6 shows the chamber arrangement for forming the plaster casting.
FIG. 7 shows the vacuum pouring chamber.
FIG. 8 shows a heat sink with guides.

DESCRIPTION OF PREFERRED EMBODIMENTS

Turning now to a discussion of the drawings, FIG. 1 shows in perspective a preferred heat sink 10 of this invention. FIG. 2 is a top view of FIG. 1. The, heat sink 10 includes a base 12 and an array of pins 14, each pin 14 having a length (a), and an elliptical cross section with a major axis (b) and a minor axis (c). Typically the length (a) is three inches, the length of major axis is 0.200 inches, the length of the minor axis is 0.050 inches corresponding to ratios a/b=15 and a/c=60. In contrast, the ratio of thickness to length that can be achieved with die casting is about 18:1.

FIG. 3 is a flowchart of the method for producing the castings of this invention. Further details of the steps for practicing the method are discussed as follows:

Step 1. A wax pattern having the shape of a heatsink is made by pouring molten wax into the cavity of a specially constructed tool and then pushing the heatsink back out of the tool such as to not deform the wax casting.

Step 2. A number of solidified wax patterns are mounted onto a wax pouting spout, or "gate" thereby forming "tree" of wax patterns which is then place inside a container.

Step 3. The container is placed into a chamber The chamber is connected to a vacuum pump and evacuated thereby removing most of the ambient gases. The chamber is provided with one opening for evacuating the chamber and a second opening allowing the container to communicate with a reservoir of (precured) plaster slurry.

Step 4. The plaster slurry is poured into the evacuated container and then allowed to set (solidify) thereby producing a plaster casting.

Step 5. The plaster casting with wax pattern is removed from the chamber and heated to a moderate temperature allowing the wax to melt and drain from the plaster mold.

Step 6. The paster casting is then placed in an oven and heated to a temperature of at least 1350 degrees (fahrenheit) at which temperature the wax has been drained out of the cavities and any remaining wax and moisture in the plaster casting has been removed.

Step 7. The plaster casting is placed in a vacuum chamber together with a ladle of molten aluminum and the chamber is evacuated.

Step 8. When the temperature of the plaster casting has dropped to about 550 degrees fahrenheit, the ladle is tipped using a handle that extends through the wall of the vacuum oven thereby pouring the aluminum into the cavities of the plaster casting. A selected molten aluminum alloy is poured through the gate into the heatsink cavities while the plaster casting is evacuated.

Step 9. The plaster casting is broken away leaving the cast heatsink.

FIG. 4 shows a perspective exploded view of the tool 16 for forming the wax pattern including a cavity block 18, a stripper 20, a lid 22 and a knockout plate 24. The assembled tool 16 is shown in FIG. 5 The cavity block 18 has a recessed region 26 for forming the baseplate of the heatsink. The elongated cavities 28 for forming the pins are shown extending (in phantom) from the baseplate recessed region 26. Also shown is an array of nine holes 30 into which knockout rods 32 of knockout plate 24 slide. The stripper 20 maintains separation of the knockout plate 24 and cavity block 18 while wax is pouted through gate hole 34 into the mold assembled as shown in FIG. 5. After the wax has hardened, the stripper plate 20 is withdrawn and the knockout plate 24 is pushed toward the cavity block 18 such that the rods 32 pushing against the baseplate of the wax casting forces the wax heatsink pattern from the cavity block 18.

FIG. 6 shows details of the apparatus 36 for casting the plaster. A plurality of wax patterns have been secured to a gate to form a tree 38. The tree 38 is shown mounted securely on a plastic base 40. A container 42 (cutaway) is placed over the tree 38 and into contact with the plastic base 40 such that a water tight seal 44 is formed. The plastic base 40 with tree 38 and container 42 is then placed into a chamber 46 which has a first valve 54 controlled passage 52 to a vacuum pump 56 and a second valve 48 controlled passage 50 leading to a reservoir 58 of plaster slurry 60. The vacuum chamber 46 is first evacuated to a required vacuum. Then the second valve 48 is opened allowing the plaster slurry 60 to pour into the container 42 so as to encase the tree 38 of heatsink patterns.

After the plaster casting has set and cured, it is placed in an oven (not shown) and heated to drain the wax from cavities in the casting and then heated to above 1350 degrees fahrenheit to burn off any wax residue and also drive off moisture from the plaster casting.

While the plaster casting 66 is still at a temperature of about 550 degrees fahrenheit, it is transferred to a chamber 62 containing a ladle 64 of molten alloy as shown in FIG. 7. The chamber 62 is evacuated by pump 68 and then a handle 70 protruding through the wall of the chamber is turned thereby tipping the ladle 64 so as to pour the molten alloy into the runner and cavities of the tree 38 of heatsinks. Thereafter, the plaster casting 66 is broken away from the heatsinks 10.

A major advantage of the method of this invention is the ability to select the most advantageous alloy to make the cast heatsinks in terms of heat conductivity while avoiding cracking of the cast heatsink that occur when these same alloys are diecast. Mismatches in shrinkage between the plastic casting and the heatsink as the heatsink solidifies does not cause cracking of the cast alloy because of the yielding nature of the plaster compared to, e.g., the metal molds used in a die casting process. As a result, a higher density of pins is achieved in the heatsink of this invention than can be achieved with the diecast method of manufacturing.

As a further consequence of latitude in selection of alloy, an aluminum alloy such as Al356 is selected having a coefficient of expansion that closely matches the thermal coefficient of expansion of the ceramic or plastic electronic part (I.C. chip) that it is intended to cool. Therefore, when the heatsink has been installed against the electronic part, the heat absorbing surface of the heatsink remains in intimate contact with the electronic part over a wide temperature range thereby maintaining reliable heat dissipating capability.

In order to minimize occurrence of cracks in the diecast part, the die casting method such as described in U.S. Pat. No. 5,215,140 is limited to the casting of alloys such as Al 380 which have a coefficient of expansion that more nearly matches the coefficient of expansion of the steel mold rather than the coefficient of expansion of the electronic part. Castings of Al380 are well known to be more porous than castings made of alloys such as Al386 which are feasibly used in the practice of the present invention.

Castings made using the method of this invention are found to be more dense than similar casting made using the die casting technique for other reasons in addition to selection of the alloy. As discussed in the BACKGROUND, the molten metal pouring into a metal mold (as in diecasting) forms a skin at the interface with the mold and the melt and because of shrinkage during freezing, voids are formed in the casting as the alloy solidifies from the interface toward the center of the melt. The result is that the casting is porous achieving only about 90% maximum density of the cast metal as disclosed in U.S. Pat. No. 5,215,140. This porosity occurs in spite of the evacuation step. In contrast, the heat conductivity of the plaster casting is much lower than the conductivity of the steel mold so that there is not the tendency to form the skin in the former case and solidification coccurs much more uniformly throughout the melt.. Consequently the castings made according to the method of the present invention achieve a density of at least 95% because the small thermal conductivity of the plaster casting does not cause the formation of the skin as a first step in solidification.

Another major advantage of the small heat conductivity of the plaster casting of this invention is the ability to produce heatsinks having pins in which the ratio of the length of the pin to the smallest dimension of the cross section of the pin (perpendicular to the length) is much larger than can be achieved by the methods of the prior art, particularly diecasting such as disclosed in U.S. Pat. No. 5,215,140.

The advantage of the elliptical cross section is that the current of air directed parallel to the major axes of the ellipse flows with minimal turbulence through the array. The elliptical shape of the pins provides a greater area of heat dissipating surface per area of base than if the pins were circular.

FIG. 8 shows a variation of the heat sink of this invention in which thin continuous walls 72 are cast along with the array of pins 14 wherein the walls 72 are positioned to provide the most effective path of air current for dissipating heat. There is shown the array of elliptical pins 14 as shown in FIG. 1 but with two walls 72 positioned along the outside edge of the array so as to channel the air current from one edge of the array to the opposite edge.

Other variations and modifications are suggested by studying the specification and drawings which depend on the circumstances of use. For example, the cavity block 28 may be made either of metal or commercially available elastomeric material such as neoprene or other suitable compound. I therefore wish to define the scope of my invention by the appended claims

I claim:

1. A method for making a heatsink, said heatsink being an integral casting and having a baseplate and an array of a plurality of pins, each pin having an end secured vertically onto a first surface of said baseplate and each pin being greater than one half inch long with an elliptical cross section wherein a ratio of a length of each pin divided by a smallest dimension of said cross section is greater than a value of ten and a ratio of a largest dimension of said cross section divided by a smallest dimension of said cross section is greater than a value of 2.5, said method including the steps in operable order:

(a) assembling a tool means for forming a wax pattern wherein said tool means comprises;
(i) a cavity block having a cavity with a shape that mates with a shape of said heatsink such that one region of said cavity is a baseplate cavity communicating with elongated pin cavities each elongated pin cavity corresponding to one pin of said plurality of pins and extending vertically away from one surface of said baseplate cavity;
(ii) said cavity block having a plurality of elongated knockout holes, each being substantially parallel to one another and to each elongated pin cavity:

(iii) each elongated knockout hole having one end opening onto said one surface of said baseplate cavity corresponding to said first surface of said baseplate and another end opening onto a surface of said cavity block opposite said one surface of said baseplate cavity and adapted for slidably receiving knockout rods:

(iv) a knockout fixture being a knockout plate and a plurality of knockout rods, each knockout rod having one end attached vertically to a surface of said knockout plate and arranged such that each knockout rod of said plurality of knockout rods is slidably positionable in one said knockout hole respectively:

(v) a stripper means for supporting said cavity block in spaced relation to said knockout plate wherein each said knockout rod has a length such that when said stripper means supports said cavity block in said spaced relation to said knockout plate, end surfaces of said knockout rods are even with said one surface of said baseplate cavity and when said stripper means is removed from supporting said cavity block in said spaced relation to said knockout plate and said knockout plate is moved toward said cavity block, said knockout rods slidably extend through said cavity such as to force a casting in said cavity out of said cavity when a casting has been formed in said cavity:

(vi) a lid for covering an opening in said cavity and forming a second surface of said baseplate cavity opposite said first surface:

(vii) said lid having an opening through which molten wax can be poured into said cavity when said lid is in position on said cavity block covering said cavity:

(b) forming a wax pattern by pouring molten wax into said cavity of said assembled tool;

(c) separating said wax pattern from said tool after said molten wax has solidified by removing said stripper means and forcing said knockout plate toward said cavity block:

(d) mounting the solidified wax pattern onto a wax gate and placing said wax pattern of said heatsink and gate inside a container;

(e) placing the container into a chamber communicating with a vacuum pump through one valve and a reservoir of precured plaster slurry through another valve;

(f) evacuating the container with wax casting to substantially remove the ambient gases;

(g) admitting plaster slurry into said container from said reservoir and allowing said plaster slurry in said container to set thereby forming a plaster casting encasing said wax pattern of said heatsink and gate;

(h) removing said plaster casting with wax pattern from said chamber and heating said casting to a purging temperature such as to allow said wax to be drained and burned out of said plaster casting and to drive moisture out of said plaster casting thereby leaving a cavity corresponding to said heat sink in said plaster casting;

(i) placing said plaster casting in a vacuum chamber together with a ladle of molten alloy and evacuating said chamber to remove ambient gases;

(j) tipping the ladle such as to pour the alloy into the cavities of the plaster casting when the temperature of the plaster casting has dropped to about 550 degrees fahrenheit, thereby forming a casting of said at least one heatsink;

(k) breaking the plaster casting away from said casting of said heatsink.

2. A method as in claim 1 wherein said cavity block is made of a material that is selected from a group that consists of a metal and an elastomeric compound.

3. A method as in claim 1 wherein step (i) comprises placing said ladle of molten aluminum alloy Al 386.

4. An apparatus for making a wax pattern of a heatsink, said heatsink being integrally cast and having a baseplate and an array of a plurality of pins each pin having an end secured vertically onto a surface of said baseplate and each pin being greater than one half inch long with an elliptical cross section wherein a ratio of a length of each pin divided by a smallest dimension of said cross section is greater than a value of ten and a ratio of a largest dimension of said cross section divided by a smallest dimension of said cross section is greater than a value of 2.5, which apparatus comprises:

a tool means for forming a wax pattern having
(i) a cavity block with said cavity having a shape mating with a shape of said at least one heatsink such that said cavity has a baseplate cavity communicating with elongated pin cavities each elongated pin cavity corresponding to one pin of said plurality of pins and extending vertically away from one surface of said baseplate cavity;

(ii) said cavity block having a plurality of elongated knockout holes, each being substantially parallel to one another and to each elongated pin cavity;

(iii) each elongated knockout hole having one end opening onto said one surface of said baseplate cavity corresponding to said first surface of said baseplate and another end opening onto a surface of said cavity block opposite said surface of said baseplate cavity and adapted for slidably receiving knockout rods:

(iv) a knockout fixture being a knockout plate and a plurality of knockout rods, each knockout rod having one end attached vertically to a surface of said knockout plate and arranged such that each knockout rod of said plurality of knockout rods is slidably positionable in one said knockout hole respectively;

(v) a stripper means for supporting said cavity block in spaced relation to said knockout plate wherein each said knockout rod has a length such that when said stripper means supports said cavity block in said spaced relation to said knockout plate, end surfaces of said knockout rods are even with said surface of said baseplate cavity and when said stripper means is removed from supporting said cavity block in said spaced relation to said knockout plate and said knockout plate is moved toward said cavity block, said knockout rods extend through said cavity such as to force a casting in said cavity out of said cavity when a casting has been formed in said cavity:

(vi) a lid for covering an opening in said cavity and forming a second surface on said heatsink opposite said first surface:

(vii) said lid having an opening through which molten wax can be poured into said cavity when said lid is covering said cavity.

5. An apparatus to be used in making a heatsink wherein said heatsink is an integral casting and has a baseplate and an array of a plurality of pins, each pin having an end secured vertically onto a first surface of said baseplate and each pin being greater than one half inch long with an elliptical cross section wherein a ratio of a length of each pin divided by a smallest dimension of said cross section is greater than a value of ten and a ratio of a largest dimension of said cross section divided by a smallest dimension of said cross section is greater than a value of 2.5, said apparatus comprising:

a tool means for forming a wax pattern having
   (i) a cavity block with said cavity having a shape mating with a shape of said at least one heatsink such that said cavity has a baseplate cavity communicating with elongated pin cavities, each elongated pin cavity corresponding to one pin of said plurality of pins and extending vertically away from one surface of said baseplate cavity;
   (ii) said cavity block having a plurality of elongated knockout holes each being substantially parallel to one another and to each elongated pin cavity;
   (iii) each elongated knockout hole having one end opening onto said one surface of said baseplate cavity corresponding to said first surface of said baseplate and another end opening onto a surface of said cavity block opposite said surface of said baseplate cavity and adapted for slidably receiving knockout rods:
   (iv) a knockout fixture being a knockout plate and a plurality of knockout rods, each knockout rod having one end attached vertically to a surface of said knockout plate and arranged such that each knockout rod of said plurality of knockout rods is slidably positionable in on said knockout hole respectively:

means for evacuating, means adapted for heating, means for evacuating, container means, tool means
   (v) a stripper means for supporting said cavity block in spaced relation to said knockout plate wherein each said knockout rod has a length such that, when said stripper means supports said cavity block in said spaced relation to said knockout plate, end surfaces of said knockout rods are even with said surface of said baseplate cavity and when said stripper means is removed from supporting said cavity block in said spaced relation to said knockout plate and said knockout plate is moved toward said cavity block, said knockout rods extend through said cavity such as to force a casting in said cavity out of said cavity when a casting has been formed in said cavity;
   (vi) a lid for covering an opening in said cavity and forming a second surface on said heatsink opposite said first surface:
   (vii) said lid having an opening through which molten wax can be poured into said cavity when said lid is covering said cavity;

a container means adapted for containing a plaster casting, said plaster casting encasing said wax pattern;

means for evacuating said container means and adapted for backfilling said evacuated container with plaster such that said plaster casting encases said wax pattern;

means adapted for heating said plaster casting such as to drain wax from said cavities, burn out traces of wax from said cavities, and evaporate moisture from said plaster casting;

means for evacuating said plaster casting and pouring molten metal into said cavities in said evacuated casting, said plaster casting made from plaster that is yielding to stresses generated by molten metal solidifying in cavities of said plaster casting such that cracks are prevented from forming in said solidifying molten metal.

6. An apparatus as in claim 1 wherein said means for evacuating said plaster casting comprises:
a chamber for holding said container;
said chamber having a first port with a first control valve adapted for connection to a vacuum pump such that said vacuum pump communicates with said chamber;
a ladle means adapted for holding molten metal supported in said chamber and having a handle extending through a wall of said chamber such that when said chamber is evacuated and when said handle is turned, molten metal in said ladle pours into cavities in said plaster casting.

7. An integrally cast heatsink which comprises:
a baseplate;
an array of a plurality of pins, each pin of said plurality of pins having one end perpendicularly secured to said baseplate;
each pin of said plurality of pins having a length perpendicular to said base and an elliptical cross section perpendicular to said length, said elliptical boundary having a major axis and a minor axis wherein a ratio of said major axis to said minor axis has a numerical value greater than two and one half and wherein a ratio of said length of said major axis has a numerical value greater than ten wherein said length has a value greater than one half inch, and a ratio of said length to said major axis has a value greater than ten.

8. A heatsink as in claim 7 wherein said heatsink comprises aluminum Al 386 alloy.

* * * * *